US009799726B1

(12) United States Patent
Khalil

(10) Patent No.: US 9,799,726 B1
(45) Date of Patent: Oct. 24, 2017

(54) VERTICAL SUPER JUNCTION III/NITRIDE HEMT WITH VERTICALLY FORMED TWO DIMENSIONAL ELECTRON GAS

(71) Applicant: HRL Laboratories, LLC, Malibu, CA (US)

(72) Inventor: Sameh G. Khalil, Encino, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/395,799

(22) Filed: Dec. 30, 2016

Related U.S. Application Data

(62) Division of application No. 14/743,696, filed on Jun. 18, 2015, now Pat. No. 9,601,610.

(51) Int. Cl.
*H01L 29/06* (2006.01)
*H01L 29/778* (2006.01)
*H01L 29/66* (2006.01)
*H01L 29/20* (2006.01)

(52) U.S. Cl.
CPC ...... *H01L 29/0634* (2013.01); *H01L 29/2003* (2013.01); *H01L 29/66431* (2013.01); *H01L 29/7788* (2013.01)

(58) Field of Classification Search
CPC .............. H01L 29/0634; H01L 29/003; H01L 29/66431; H01L 29/7788
See application file for complete search history.

(56) References Cited

U.S. PATENT DOCUMENTS

| 4,754,310 | A | 6/1988 | Coe |
| 7,038,253 | B2 | 5/2006 | Yoshida et al. |
| 7,098,093 | B2 | 8/2006 | Clarke et al. |
| 7,308,253 | B2 | 12/2007 | Moody et al. |
| 9,490,357 | B2 | 11/2016 | Khalil et al. |
| 9,601,610 | B1 | 3/2017 | Khalil |
| 2003/0190789 | A1 | 10/2003 | Salama et al. |

(Continued)

FOREIGN PATENT DOCUMENTS

| EP | 2549528 | 1/2013 |
| JP | 05-129344 | 5/1993 |
| JP | 2009-099774 | 5/2009 |
| JP | 2009-170746 | 7/2009 |

OTHER PUBLICATIONS

M.A Briere "Understanding the Breakdown Characteristics of Lateral GaN-Based HEMTs", How2Power Today Newsletter, pp. 1-5, (2013).

(Continued)

*Primary Examiner* — Matthew Reames
(74) *Attorney, Agent, or Firm* — Ladas & Parry

(57) ABSTRACT

A HEMT device comprising a M-plane III-Nitride material substrate, a p-doped epitaxial layer of III-Nitride material grown on said substrate; a recess etched in said p-doped epitaxial layer, the recess having a plane wall parallel to a polar plane of the III-Nitride material; a carrier carrying layer formed on said plane wall of the recess; a carrier supply layer formed on said at least one carrier carrying layer, such that a 2DEG region is formed in the carrier carrying layer at the interface with the carrier supply layer along said plane wall of the recess; a doped source region formed at the surface of said p-doped epitaxial layer such that the doped source region is separated from said 2DEG region by a channel region; a gate insulating layer formed on the channel region; and a gate contact layer formed on the gate insulating layer.

14 Claims, 8 Drawing Sheets

(56) References Cited

U.S. PATENT DOCUMENTS

| | | |
|---|---|---|
| 2006/0180831 A1 | 8/2006 | Nakazawa et al. |
| 2008/0142845 A1 | 6/2008 | Kodama et al. |
| 2009/0039421 A1 | 2/2009 | Otake et al. |
| 2009/0057684 A1 | 3/2009 | Otake et al. |
| 2013/0337619 A1 | 12/2013 | Zhu |
| 2014/0159048 A1 | 6/2014 | Huang et al. |
| 2015/0014700 A1 | 1/2015 | Khalil et al. |
| 2015/0021686 A1 | 1/2015 | Shea et al. |
| 2015/0333170 A1 | 11/2015 | Li et al. |
| 2016/0064555 A1 | 3/2016 | Chu |

OTHER PUBLICATIONS

International Search Report and Written Opinion from PCT/US2014/046438 dated Oct. 21, 2014.
International Preliminary Report on Patentability (Chapter 1) from PCT/US2014/046438 dated Jan. 28, 2016.
From U.S. Appl. No. 14/329,745 (now U.S. Pat. No. 9,490,357), Restriction mailed on Dec. 7, 2015.
From U.S. Appl. No. 14/329,745 (now U.S. Pat. No. 9,490,357), Non Final Office Action dated Feb. 29, 2016.
From U.S. Appl. No. 14/329,745 (now U.S. Pat. No. 9,490,357), Notice of Allowance dated Jul. 8, 2016.
From U.S. Appl. No. 14/743,696 (now U.S. Pat. No. 9,601,610), Restriction mailed on Dec. 16, 2015.
From U.S. Appl. No. 15/286,367, Kahlil et al., filed Oct. 5, 2016.
From U.S. Appl. No. 14/743,696 (now U.S. Pat. No. 9,601,610), Non Final Rejection dated Mar. 31, 2016.
From U.S. Appl. No. 14/743,696 (now U.S. Pat. No. 9,601,610), Notice of Allowance dated Aug. 11, 2016.
From U.S. Appl. No. 14/743,696 (now U.S. Pat. No. 9,601,610), Notice of Allowance dated Nov. 7, 2016.
From U.S. Appl. No. 15/286,367 (unpublished) Application and Office Actions.
From EPO Application No. 14826223.1, EPO Supplementary Search Report and Opinion dated Feb. 15, 2017.

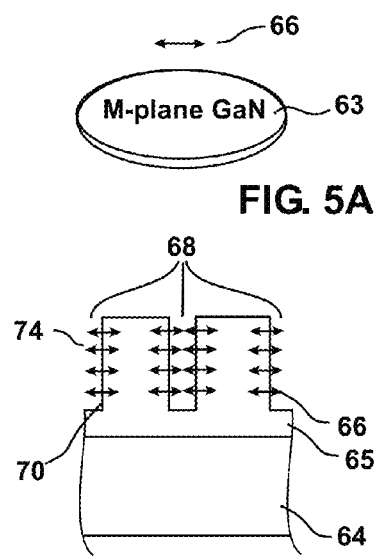
FIG. 5A
FIG. 5B
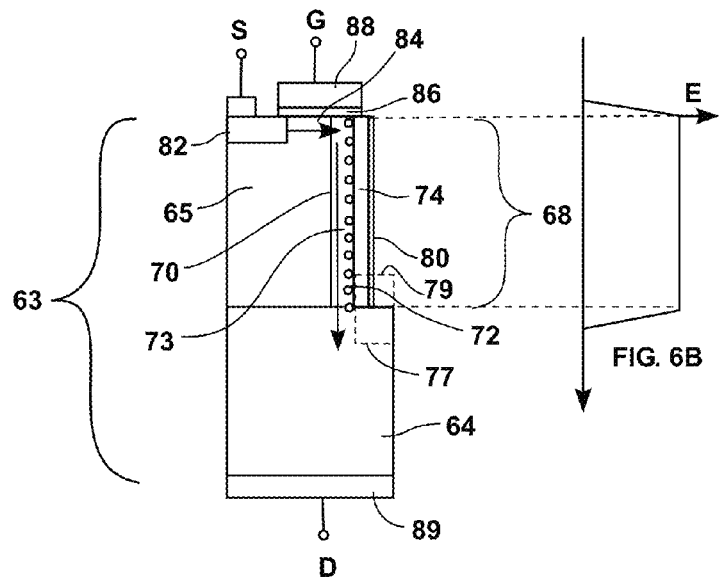
FIG. 6A
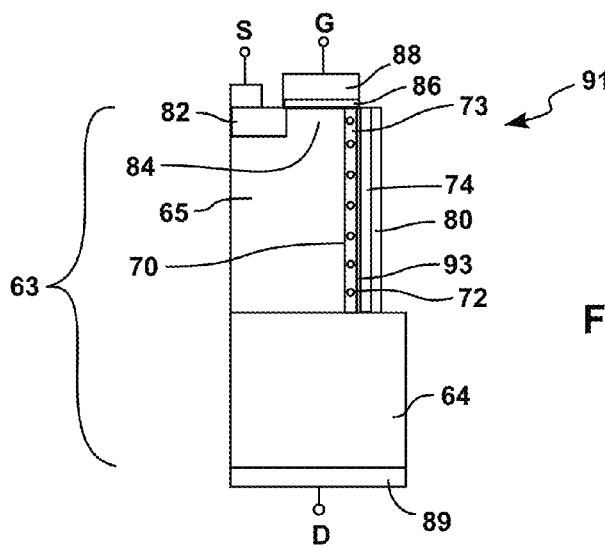
FIG. 6C

US 9,799,726 B1

VERTICAL SUPER JUNCTION III/NITRIDE HEMT WITH VERTICALLY FORMED TWO DIMENSIONAL ELECTRON GAS

RELATED APPLICATIONS

This application claims the benefit of and is a divisional of U.S. patent application Ser. No. 14/743,696 filed on Jun. 18, 2015, the disclosure of which is incorporated herein by reference.

The present application is related to U.S. patent application Ser. No. 14/329,745, filed on Jul. 11, 2014, which is hereby incorporated by reference.

The present application is related to U.S. patent application No. 61/846,489, filed on Jul. 15, 2013, which is hereby incorporated by reference.

FIELD OF THE INVENTION

The present invention relates generally to integrated circuits or devices having elements operating with a 2-dimension electron gas (2DEG), and relates in particular to a Super Junction III-Nitride high voltage vertical HEMTs operating with a 2DEG.

BACKGROUND

In known III-Nitride HEMT devices used in power applications, there exists a design trade-off between the on-state resistance and breakdown voltage (Bv). Known high voltage GaN HEMT devices use a technology and process flow based on a lateral device structure where a large drift region supports the off-state voltage that extends laterally, and where a high mobility 2DEG sheet is oriented horizontally.

FIG. 1A illustrates a cross-section of a portion of a prior art high voltage HEMT 10 comprising a narrow-bandgap channel layer 12, or carrier carrying layer, for example of undoped GaAs or GaN, formed on top of a buffer structure 13 itself formed on top of a substrate 14 such as a Si substrate. A wide-bandgap carrier supplying layer 15, or barrier layer, for example a highly-doped n-type AlGaAs or AlGaN layer, is formed on top of channel layer 12. HEMT 10 comprises a channel region 16 formed in channel layer 12 between a conductive source region 17 and a conductive drain region 18 both formed through the carrier supplying layer 15 into channel layer 12. A passivation layer 19 covers carrier supplying layer 15 above the channel region 16. A gate region 20, insulated by an insulator layer 21, traverses the passivation layer 19 into the carrier supplying layer 15. Alternatively, gate region 20 insulated by insulator layer 21 can traverse the passivation layer 19 to come in contact with the surface of carrier supplying layer 15. In addition, HEMT 10 comprises field plates 22, 23 attached respectively to gate region 20 and source region 17.

In HEMT 10, the drift region which extends from the edge of gate region 20 to the drain region 18 is oriented horizontally with the function of supporting high drain to source and high drain to gate voltage during the off-state operation. A second important feature of HEMT 10 is a two dimensional electron gas layer 24 which forms in the carrier carrying layer 12 right below the interface between the carrier supplying layer 15 (AlGaN) and the carrier carrying layer 12 (GaN layer). 2DEG layer 24 has a high carrier mobility that can for example reach 2100 cm2/V·sec. If the AlGaN layer thickness is increased beyond a certain value, a 2DEG will form under the interface with the density of 2DEG increasing with both the thickness of the AlGaN layer and the Al mole fraction.

A horizontal 2DEG HV GaN based HEMT such as lateral HEMT 10 is considered, at the present time, to be a preferred candidate to lead the power electronics roadmap due to its superior material properties such as high critical electric field, wide band-gap and high saturation velocity as well as the ability to utilize a high density of sheet charge that can move in the 2DEG layer with high mobility. However, for higher voltage devices with ratings for example above 600V, the horizontal drift region becomes relatively large which in turn results in a larger cell pitch and higher product of on-state resistance and chip area Ron.A, where A is the area of the device chip.

The product Ron.A is an important figure of merit in power devices as it directly impacts the cost of the die. A further impact on die cost comes from a lower yield associated with larger die area which is particularly significant for lateral GaN.

While still more favorable than their Silicon counterparts, High Voltage GaN based lateral HEMTs become less attractive than vertical GaN based devices as the blocking voltage increases due to the requirement for longer drift region to support the off-state drain voltage.

FIG. 1B illustrates a cross-section of a portion of a prior art high voltage super junction MOSFET 25 as disclosed for example in US2015/0021686 to Shea. Super junction MOSFET 25 is formed from a P-doped base substrate material 26, and includes P-channel area 27, P+ source contact region 28, N+ source contact region 29, and N+ drain contact region 30. A gate dielectric 31 is formed over base substrate material 26, and polysilicon (poly) gate 32 is formed over the gate dielectric. A super junction structure comprising N-doped stripes 33 and P-doped stripes 34 runs from an area under poly gate 32 to N+ drain contact region 30. N-doped stripes 33 include a width Wn. P-doped stripes 34 include a width Wp. Stripes 33 and 34 include a junction depth into base substrate material 12, Xj, which is the same for each stripe. Stripes 33 and 34 are doped as heavily as possible while still fully depleting prior to the breakdown of MOSFET cell 30. The super junction is used to provide as much heavily doped area between N+ drain contact region 30 and poly gate 32 as possible.

The super junction removes the relationship between BVdss and doping concentration, as is the case with a conventional MOSFET cell that would use an LDD, or drift, region between N+ drain contact region 30 and poly gate 32. A higher doping concentration is used in the super junction as compared to a LDD region, resulting in lower RDSON. MOSFET 25 improves the RDSON of the MOSFET without a significant increase in Qg, resulting in a net reduction of total power loss.

The super junction in MOSFET 25 maintains a high BVdss despite a high doping concentration by replacing the depletion region between a known LDD region and the base substrate material with a plurality of depletion regions between each adjacent N-doped stripe 33 and P-doped stripe 34. Stripes 33 and 34 deplete each other instead of base substrate material 26, therefore the electric field of the super junction is oriented laterally.

FIG. 1C illustrates the electric field of the super junction in the off-state of MOSFET 25C. In the off-state of MOSFET 25, charge carriers in the stripes 33 and 34 deplete by drifting under the electric field towards their respective contacts, leaving behind bound ion charges which are negative acceptor atoms in the p-stripes and positive donor ions in the n-stripes. If the opposite bound ion charges are equal in magnitude and closely spaced, the net effective charge will sum to a net zero value. The consequence of this net zero value of charge, according to the Poisson's equation, is a flat electric field distribution as illustrated in FIG. 1C. The advantages of the Super Junction does not come without constrains which is mainly set by the requirement for tight fabrication control to ensure charge balance between the n and p pillars, in addition to the need for multiple fabrication steps.

The doping concentrations of stripes 33 and 34 are calibrated such that the stripes fully deplete prior to breakdown of MOSFET cell 25. After stripes 33 and 34 are fully depleted, the voltage at drain contact region 30 is supported by the length, $L_{sj}$, of the super junction. When the super junction is fully depleted, the electric field from applied voltage at N+ drain contact 30 to poly gate 32 is oriented lengthwise through the super junction. Making stripes 33 and 34 longer increases BVdss by stretching the electric fields over a longer distance, reducing the magnitude of the electric fields. However, despite improved properties, super junction MOSFET 25 still introduces a significant cell pitch.

In a vertical configuration (vertical power device) the cell pitch is reduced significantly because the drift region extends vertically. The lateral dimension in such structure is limited only by process constraints and punch-through breakdown considerations. This implies that the Ron.A product will be much lower for the vertical device as compared to lateral devices and this is especially true for higher voltage ratings.

FIG. 2 illustrates a cross-section of a portion of a known vertical GaN FET 40 comprising a substrate 42, for example made of N+ GaN, on top of which is arranged a drift layer 44 for example made of low doped N− GaN. The FET 40 comprises no 2DEG and no super junction. A channel layer 46, for example of undoped GaN, is arranged on top of drift layer 44 and is covered by a source contact region 48. Source contact region 48 and channel region 46 are traversed by a gate trench 50 that extends into drift region 44. A gate insulator layer 52 lines the gate trench 50 and a gate contact region 54 fills up the space left in the gate trench by the gate insulator layer 52. A drain electrode 56 is arranged on the bottom surface of substrate 42; source and gate electrodes contact the source and gate contact regions, on the top surface of FET 40. FET 40 comprises a drift region 58 that extends vertically in the drift layer 44, whereby current conduction in FET 40 is vertical and the voltage across the device in the off-state is supported across the vertically-oriented drift region.

The vertical configuration of FET 40 translates into a significant reduction of the cell pitch for a transistor having a high voltage rating. The cell pitch for a vertical device such as FET 40 is mainly determined by photolithography, process constrains to implement the vertical structure and punch through considerations. For a given technology maturity level of a vertical power device such as GaN FET 40 and lateral power device such as Gan HEMT 10, a breakeven point of the voltage rating in terms of value proposition is set. Below the breakeven point, the lateral configuration makes more business sense and above it the vertical configuration is more favorable. The breakeven point can be determined by the drift region length (which is design related), cell pitch, cost of starting material in addition to process complexity and mask count of each of the two configurations.

Known vertical GaN-based devices rely on bulk GaN drift region in which the high electron density and high mobility layers are absent. Bulk GaN devices rely on bulk mobility, which is considerably lower than the 2DEG mobility. The inventors have noted that for high voltage devices with voltage ratings larger than 600V, vertical GaN HEMTs would often be preferable compared to lateral GaN HEMT.

Furukawa U.S. Pat. No. 7,038,253 B2 issued on May 2, 2006 discloses a GaN-based field effect transistor of a normally-off type, which has an extremely small ON resistance during operation and is capable of a large-current operation, which comprises source and drain electrodes; a channel portion made of a first GaN-based semiconducting material that is an i-GaN-based semiconducting material or a p-GaN-based semiconducting material. The channel portion is so formed as to be electrically connected to the source and drain electrodes. First and second electron supply portions made of a second GaN-based semiconducting material have greater bandgap energy than the first GaN-based semiconducting material, the first and second electron supply portions being joined to the channel portion and located separately from each other. An insulating layer, formed on the surface of the channel portion, spreads between the first and second electron supply portions; and a gate electrode is disposed on the insulating layer.

Rohm Co. U.S. Patent Application Publication US 2009/0057684 to Hirotaka entitled "Nitride Semiconductor Device and Method for Producing Nitride Semiconductor Device" discloses a Nitride semiconductor device that includes: a semiconductor base layer made of a conductive group III-Nitride semiconductor having a principal plane defined by a nonpolar plane or a semipolar plane; an insulating layer formed on the principal plane of the semiconductor base layer with an aperture partially exposing the principal plane; a Nitride semiconductor multilayer structure portion, formed on a region extending onto the insulating layer from the aperture, having a parallel surface parallel to the principal plane of the semiconductor base layer as well as a +c-axis side first inclined surface and a −c-axis side second inclined surface inclined with respect to the principal plane of the semiconductor base layer and including two types of group III Nitride semiconductor layers at least having different lattice constants; a gate electrode formed to be opposed to the second inclined surface; a source electrode arranged to be electrically connected with the group III Nitride semiconductor layers; and a drain electrode formed on a back surface of the semiconductor base layer opposite to the principal plane.

U.S. Pat. No. 7,098,093 to Clarke discloses a HEMT type device which has pillars with vertical walls perpendicular to a substrate. The pillars are of an insulating semiconductor material such as GaN. Disposed on the side surfaces of the pillars is a barrier layer of a semiconductor material such as AlGaN having a bandgap greater than that of the insulating material of the pillars. Electron flow is confined to a narrow channel at the interface of the two materials. Suitable source, drain and gate contacts are included for HEMT operation.

U.S. patent application Ser. No. 14/329,745 discloses a vertical HEMT wherein at least a portion of the drift region between the gate and the drain relies on 2DEG mobility. The HEMT device comprises a III-Nitride material substrate, the surface of which follows a plane that is not parallel to the C-plane of the III-Nitride material; an epitaxial layer of III-Nitride material grown on said substrate; a recess etched in said epitaxial layer, having at least one plane wall parallel to a polar plane of the III-Nitride material; a carrier supply layer formed on a portion of the plane wall of the recess, such that a 2DEG region is formed along the portion of the plane wall of the recess; a doped source region formed at the surface of said epitaxial layer such that the doped source region is separated from said 2DEG region by a channel region of the epitaxial layer; a gate insulating layer formed on the channel region of the epitaxial layer; and a gate contact layer formed on the gate insulating layer.

U.S. Philips Corp. U.S. Pat. No. 4,754,310, issued, June 1988, discloses a Silicon based device structure applicable to FETs, bipolar, diodes etc., and uses an alternatively doped structures to support high reverse bias voltage during the blocking mode of operation.

University of Toronto, U.S. Patent application No US2003/0190789, issued October 2003, is a lateral Super Junction power MOSFET implemented on Si-On-Insulator substrates to eliminate substrate-assisted-depletion inherent in the lateral Super Junction structure.

Unpublished U.S. patent application Ser. No. 14/471,980 to Rongming Chu discloses a vertical trench MOSFET using a III-N material.

SUMMARY

The present disclosure relates to the structure of a vertical HEMT wherein at least a portion of the drift region between the gate and the drain relies on 2DEG mobility, and wherein a super junction structure provides for a uniform electric field distribution in the drift region. The present disclosure also relates to methods for manufacturing such a vertical HEMT.

An embodiment of the present disclosure comprises a HEMT device comprising: a III-Nitride material substrate, the surface of which follows a plane that is not parallel to the C-plane of the III-Nitride material; a p-doped epitaxial layer of III-Nitride material grown on said substrate; a recess etched in said p-doped epitaxial layer, the recess having at least one plane wall that is not parallel to the surface of the substrate; said at least one plane wall being parallel to a polar plane of the III-Nitride material; at least one carrier carrying layer formed on said at least one plane wall of the recess; at least one carrier supply layer formed on at least a portion of said at least one carrier carrying layer, such that a 2DEG region is formed in the carrier carrying layer at the interface with the carrier supply layer along said at least one plane wall of the recess; a doped source region formed at the surface of said p-doped epitaxial layer such that the doped source region is separated from said 2DEG region by a channel region; a gate insulating layer formed on the channel region; and a gate contact layer formed on the gate insulating layer.

According to an embodiment of the present disclosure, said p-doped epitaxial layer and said 2DEG region are arranged such that the charges introduced by said p-doped epitaxial layer, said carrier carrying layer and said 2DEG region in the off-state HEMT generate a uniform electric field distribution across the 2DEG region.

According to an embodiment of the present disclosure, said p-doped epitaxial layer of and said 2DEG region form a Super Junction structure, where a P-column of the Super Junction structure comprises said p-doped epitaxial layer and where a N-column of the Super Junction structure comprises said 2DEG region.

According to an embodiment of the present disclosure, the 2DEG charge density is adjusted such that the total charge of both the carrier carrying layer and the 2DEG result in an effective integrated charge equal to that introduced by said p-doped epitaxial layer.

According to an embodiment of the present disclosure, said channel region extends parallel to the surface of the substrate.

According to an embodiment of the present disclosure, said channel region extends parallel to said at least one plane wall of the recess.

According to an embodiment of the present disclosure, said at least one carrier supply layer and said at least one carrier carrying layer are arranged on said at least one plane wall of the recess such that a further 2DEG region is formed along the channel region.

According to an embodiment of the present disclosure, said at least one plane wall of the recess is parallel to the C-plane of the III-Nitride material.

According to an embodiment of the present disclosure, at least one plane wall of the recess is perpendicular to the surface of the substrate.

According to an embodiment of the present disclosure, the surface of the substrate follows the M-plane of the III-Nitride material.

According to an embodiment of the present disclosure, the surface of the substrate follows the A plane of the III-Nitride material.

According to an embodiment of the present disclosure, the III-Nitride material substrate is a free standing III-Nitride material substrate.

According to an embodiment of the present disclosure, the III-Nitride material is GaN.

According to an embodiment of the present disclosure, the carrier supply layer comprises one of an epitaxial single crystal AlGaN, an epitaxial single crystal GaN/AlGaN and an epitaxial single crystal AlN/AlGaN, and the carrier carrying layer comprises unintentionally doped epitaxial single crystal GaN.

According to an embodiment of the present disclosure, the carrier supply layer comprises a spacer layer formed between the carrier carrying layer and the carrier supply layer.

According to an embodiment of the present disclosure, the spacer layer comprises AlN.

An embodiment of the present disclosure comprises a method for making a HEMT device, the method comprising: providing a III-Nitride material substrate, the surface of which follows a plane that is not parallel to the C-plane of the III-Nitride material; growing a p-doped epitaxial layer of III-Nitride material on said substrate; etching in said p-doped epitaxial layer a recess having at least one plane wall that is not parallel to the surface of the substrate; said at least one plane wall being parallel to a polar plane of the III-Nitride material; forming a carrier carrying layer on said at least one plane wall of the recess; forming on at least a portion of said carrier carrying layer a carrier supply layer such that a 2DEG region is formed in the carrier carrying layer at the interface with the carrier supply layer along said at least one plane wall of the recess; forming a doped source region at the surface of said p-doped epitaxial layer, such that the doped source region is separated from said 2DEG region by a channel region; forming a gate insulating layer on the channel region; and forming a gate contact layer on the gate insulating layer.

According to an embodiment of the present disclosure, the method comprises arranging said p-doped epitaxial layer and said 2DEG region such that the charges introduced by said p-doped epitaxial layer, said carrier carrying layer and said 2DEG region in the off-state HEMT generate a uniform electric field distribution across the 2DEG region.

According to an embodiment of the present disclosure, the method comprises arranging said p-doped epitaxial layer and said 2DEG region to form a Super Junction structure, where a P-column of the Super Junction structure comprises said p-doped epitaxial layer and where a N-column of the Super Junction structure comprises said 2DEG region.

According to an embodiment of the present disclosure, the method comprises adjusting the 2DEG charge density such that the total charge of both the carrier carrying layer and the 2DEG result in an effective integrated charge equal to that introduced by said p-doped epitaxial layer.

According to an embodiment of the present disclosure, the channel region extends parallel to the surface of the substrate.

According to an embodiment of the present disclosure, the channel region extends parallel to said at least one plane wall of the recess.

According to an embodiment of the present disclosure, the method comprises arranging said at least one carrier supply layer and said at least one carrier carrying layer on said at least one plane wall of the recess such that a further 2DEG region is formed along the channel region.

According to an embodiment of the present disclosure, said least one plane wall is parallel to the C-plane of the III-Nitride material.

According to an embodiment of the present disclosure, said at least one plane wall of the recess is perpendicular to the surface of the substrate.

According to an embodiment of the present disclosure, the surface of the substrate follows the M-plane of the III-Nitride material.

According to an embodiment of the present disclosure, the surface of the substrate follows the A plane of the III-Nitride material.

According to an embodiment of the present disclosure, the III-Nitride material substrate is a free standing III-Nitride material substrate.

According to an embodiment of the present disclosure, the III-Nitride material is GaN.

According to an embodiment of the present disclosure, the carrier supply layer comprises one of an epitaxial single crystal AlGaN, an epitaxial single crystal GaN/AlGaN and an epitaxial single crystal AlN/AlGaN, and the carrier carrying layer comprises unintentionally doped epitaxial single crystal GaN.

According to an embodiment of the present disclosure, the method comprises forming a spacer layer between the carrier carrying layer and the carrier supply layer.

According to an embodiment of the present disclosure, the spacer layer comprises AlN.

An embodiment of the present disclosure comprises a semiconductor device having a superjunction drift region between two active regions, the superjunction drift region comprising at least a P-doped region extending between the two active regions, and a N-doped region extending between the two active regions adjacent the P-doped region, wherein the P-doped region and the N-doped region deplete each other at least partially; wherein the N-doped region comprises a 2DEG region.

BRIEF DESCRIPTION OF THE DRAWINGS

The invention(s) may be better understood by referring to the following figures. The components in the figures are not necessarily to scale, emphasis instead being placed upon illustrating the principles of the invention. In the figures, like reference numerals designate corresponding parts throughout the different views.

FIGS. 5A and 5B illustrate a wafer of a M-plane substrate of a III-Nitride material as well as a 2DEG formed on said M-plane substrate according to embodiments of the present disclosure.

FIGS. 6A and 6B illustrate a cross-section of a portion of a high voltage super junction vertical HEMT according to an embodiment of the present disclosure, and the electric field distribution in the super junction.

FIG. 6C illustrates a cross-section of a portion of a high voltage super junction vertical HEMT according to an embodiment of the present disclosure.

DETAILED DESCRIPTION

Figure 3A:
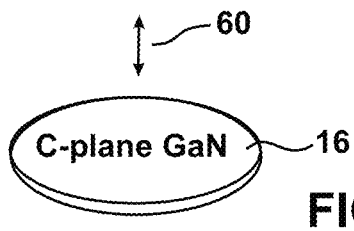
FIGS. 3a and 3B illustrate a wafer of a C-plane substrate of a III-Nitride material as well as a 2DEG formed on said C-plane substrate.
Figure 3B:
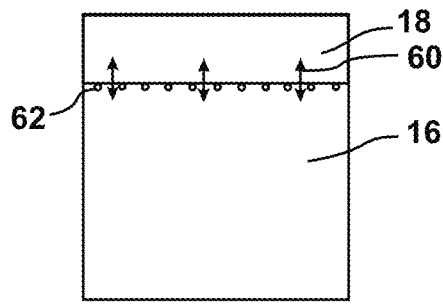

FIG. 3a illustrates a wafer of a C-plane substrate 16 of a III-Nitride material, for example GaN. The crystalline structure of the III-Nitride material is such that its C-plane is polar; i.e. exhibits noticeable spontaneous and piezoelectric polarization effects in a direction perpendicular to its surface. As illustrated in FIG. 3B, the resulting polarization field 60 can result in a two-dimensional carrier confinement, also known as 2DEG, 62 along the surface of substrate 16 if a barrier layer or carrier supplying layer 18 is formed on top of said surface.

Figure 4:
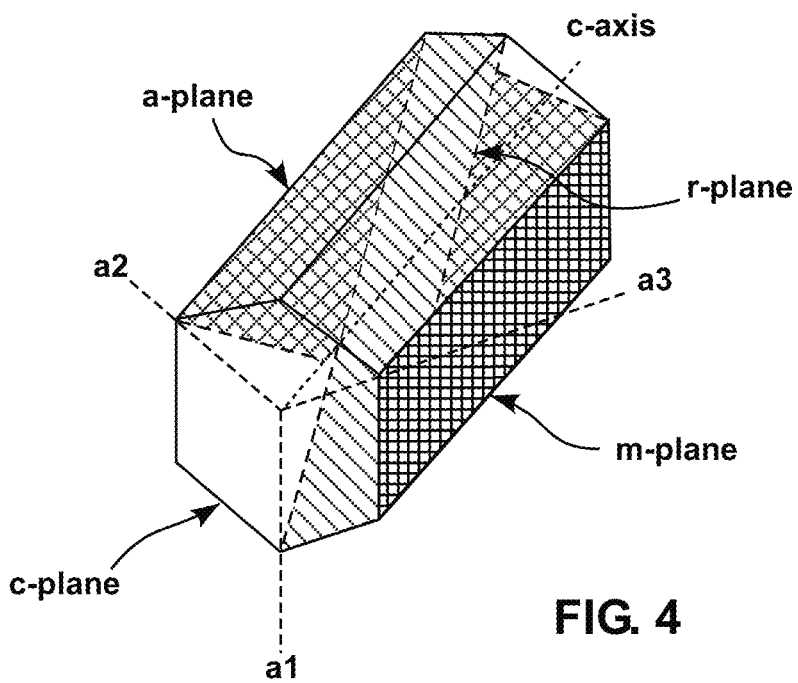
FIG. 4 is a projection view of a crystal of a III-Nitride material.

FIG. 4 is a projection view of a crystal of a III-Nitride material such as GaN, showing in particular that the III-Nitride material comprises two non-polar planes: the M-plane and the A-plane, which are perpendicular to each other and also perpendicular to the polar, C-plane.

According to an embodiment of the present disclosure, the III-Nitride substrate is preferably configured such that the surface of the substrate is parallel to the M-plane (M-plane substrate) or the A-plane of the III-Nitride material (A-plane substrate). As disclosed hereafter, such configuration allows forming in the substrate vertical trenches (trenches normal to the surface) having trench walls parallel to the C-plane of the III-Nitride material. This allows forming a dense 2DEG along the trench walls.

However, according to embodiments of the present disclosure, the III-Nitride substrate can also be configured such that the surface of the substrate makes an angle (different from 90 degree) with respect to the M-plane or the A-plane of the III-Nitride material. Such configuration allows forming in the substrate vertical trenches having trench walls not normal to the C-plane of the III-Nitride material, which allows forming along the trench walls a 2DEG of reduced density due to the angle between the trench walls and the C-plane.

FIG. 5A illustrates a wafer of a M-plane III-Nitride wafer 63 according to an embodiment of the present disclosure. The crystalline structure of the III/Nitride wafer 63 is such that its M-plane is non-polar; the polarization field 66 of the III-Nitride wafer 64 being internal and parallel to the surface of the III-Nitride wafer 63.

FIG. 5B illustrates a portion of a cross section of wafer 63. According to an embodiment of the present disclosure, the III-Nitride wafer 63 comprises a free standing bulk III-Nitride material substrate 64. According to the present disclosure, a p-doped epitaxial layer 65 of the same III-Nitride material as substrate 64 is grown (e.g. by homoepitaxial process) on the surface of substrate 64. According to an embodiment of the present disclosure, layer 65 can be a single crystal GaN layer. According to the present disclosure, P-species can be incorporated in layer 65 during the growth of layer 65, similar to what is for example disclosed in the reference: "Understanding The Breakdown Characteristics of Lateral GaN-Based HEMTs", How2Power Today Newsletter, by M. A. Briere. P-species can include Magnesium. Incorporation in-situ of the p-type dopant can be advantageous because the high temperature of the epitaxial growth process facilitates the activation of the dopant atoms. The epitaxial growth of layer 65 on a bulk substrate 64 of a same material ensures that epitaxial layer 65 has a similar crystallographic arrangement as III-Nitride substrate 64.

FIG. 5B also shows a plurality of recesses 68 etched in the p-doped epitaxial layer 65. According to an embodiment of the present disclosure, each recess 68 comprises at least one plane wall 70 that is perpendicular to the surface of the III-Nitride substrate 64, and that is parallel to the C-plane of the III-Nitride material of layer 65. The polarization field 66 present at the surface of plane wall 70 is perpendicular to the surface of plane wall 70. According to an embodiment of the present disclosure, the polarization field 66 present at the surface of plane wall 70 can result in a two-dimensional carrier confinement, or 2DEG, in the III-Nitride substrate 65 along the surface of plane wall 70 if a carrier supply layer is formed on the surface of plane wall 70. The recess/trench 68 can be formed by one of the methods used to form high aspect ratio trenches such as reactive ion etching. During the etching process the masking layer is preferably a hard mask layer, such as silicon nitride or a stack of photoresist on top of a hard masking layer or any other alternatives that will enable the definition of the trench area.

According to an alternative embodiment of the present disclosure, each recess 68 can comprise a plane wall 70 that is not normal to the surface of the III-Nitride substrate 64, and that makes an angle with respect to the C-plane of the III-Nitride material. The polarization field 66 present at the surface of plane wall 70 is then not perpendicular to the surface of plane wall 70, which results in 2DEG of reduced density in the III-Nitride substrate 65 along the surface of plane wall 70 if a carrier supply layer is formed on the surface of plane wall 70.

FIG. 6A illustrates a cross-section of a portion of a high voltage super junction vertical HEMT 75 according to an embodiment of the present disclosure. III-Nitride wafer 63 comprises a free standing bulk III-Nitride material substrate 64 and a p-doped epitaxial layer 65 of III-Nitride material grown on substrate 64. For clarity, the polarization field 66 of layer 65 is not illustrated in the present figure. According to an embodiment of the present disclosure, the polarization field 66 is perpendicular to the surface of plane wall 70 as shown in FIG. 5B. According to an embodiment of the present disclosure, the surface of III-Nitride substrate 64 follows a plane that is not parallel to the C-plane of the III-Nitride material. For example, III-Nitride substrate 64 can be an n+ M-plane free standing GaN substrate. As outlined above, the epitaxial growth of p-doped layer 65 on a bulk substrate of a same material ensures that epitaxial layer 65 has a similar crystallographic arrangement as III-Nitride substrate 64.

According to an embodiment of the present disclosure as shown in FIG. 6A, HEMT 75 comprises at least one recess 68 etched in epitaxial layer 65. According to an embodiment of the present disclosure, recess 68 can be a vertical trench that extends through epitaxial layer 65 and stops at the interface between epitaxial layer 65 and III-Nitride substrate 64, as shown in solid lines in FIG. 6A. According to an embodiment of the present disclosure, recess 68 can be a trench that extends through epitaxial layer 65 and penetrates III-Nitride substrate 64, as shown in dashed lines with the reference 77 in FIG. 6A. According to an embodiment of the present disclosure, recess 68 can be a trench that extends into epitaxial layer 65 without reaching III-Nitride substrate 64, as shown in dashed lines with the reference 79 in FIG. 6A.

According to an embodiment of the present disclosure, recess 68 comprises at least one plane wall 70 that is not parallel to the surface of the III-Nitride substrate 64. According to an embodiment of the present disclosure, plane wall 70 is parallel to a polar plane of the III-Nitride material. Where III-Nitride substrate 64 is an M-plane substrate and recess 68 is a vertical trench, plane wall 70 can be parallel to the C-plane of the material of III-Nitride substrate 64 and epitaxial layer 65.

According to an embodiment of the present disclosure, a carrier carrying layer 73 is grown on at least a portion of plane wall 70 of recess 68. According to an embodiment of the present disclosure, carrier carrying layer 73 can be made of unintentionally doped material. For example, where the III-Nitride substrate 64 is an n+ M-plane free standing GaN substrate, and epitaxial layer 65 a p-doped M-plane epitaxial layer, carrier carrying layer 73 can be an unintentionally doped GaN epitaxial layer that has a similar M-plan crystallographic arrangement as III-Nitride substrate 64 and epitaxial layer 65. The grown UID GaN can have an effective doping of n-type carriers with concentration of the order of $1 \times 10^{16}$ cm$^{-3}$. Advantageously, carrier carrying layer 73 can have a defect density lower than in epitaxial layer 65.

According to an embodiment of the present disclosure, a carrier supply layer 74 is grown on at least a portion of carrier carrying layer 73 such that a 2DEG region 72 is formed in the carrier carrying layer 73 at the interface with the carrier supply layer 74, along the surface of plane wall 70. According to an embodiment of the present disclosure, carrier supply layer 74 can be an epitaxial single crystal AlGaN, an epitaxial single crystal GaN/AlGaN or an epitaxial single crystal AlN/AlGaN. Carrier carrying layer 73 and carrier supply layer 74 can be grown by epitaxy. Aluminum mole fraction level can range from 10% to 45% for AlGaN.

In the embodiment illustrated in FIG. 6A, carrier supply layer 73 covers completely plane wall 70 and carrier supply layer 74 covers completely carrier supply layer 73, so that 2DEG region 72 extends along the entire plane wall 70.

According to an embodiment of the present disclosure, a passivation layer 80 (for example Si3N4) can be formed on carrier supply layer 74.

As shown in FIG. 6A, according to an embodiment of the present disclosure HEMT 75 comprises a doped source region 82 formed at the surface of epitaxial layer 65, for example by doping a region of the surface of epitaxial layer 65 extending parallel to the surface of substrate 64, such that the doped source region 82 is separated from the 2DEG region 72 by a channel region 84 that extends parallel to the surface of substrate 64 in the top of epitaxial layer 65 and carrier carrying layer 73. According to an embodiment of the present disclosure, HEMT 75 comprises a gate insulating layer 86 formed on the channel region 84 of the epitaxial layer 65, and a gate contact layer 88 formed on the gate insulating layer 86. According to an embodiment of the present disclosure, the gate insulating layer 86 and gate contact layer 88 cover a portion of the source region 82 and a portion of carrier supply layer 74. According to an embodiment of the present disclosure, HEMT 75 comprises a drain contact region 89 on the bottom surface of substrate 76.

According to an embodiment of the present disclosure, at least a portion of the drift region of HEMT 75 comprises 2DEG region 72. According to an embodiment of the present disclosure, p-doped epitaxial layer 65 forms the P-doped stripe, or column, of a super junction and 2DEG region 72, along with carrier carrying layer 73, form the N-doped stripe, or column, of the super junction. According to an embodiment of the present disclosure, the effective n-type charge of the super junction is the total charge of both the UID carrier carrying layer 73 and the 2DEG layer 72 formed at the heterointerface between the UID carrier carrying layer 73 and the carrier supply layer 74.

According to an embodiment of the present disclosure, p-doped epitaxial layer 65 and 2DEG region 72 are arranged such that, in the off-state HEMT, the charges introduced by the p-doped epitaxial layer 65, the carrier carrying layer 73 and the 2DEG region 72 generate a uniform electric field distribution across the 2DEG region. Preferably, the charge density of 2DEG region 72 is adjusted such that the total charge of both the carrier carrying layer 73 and the 2DEG region 72 result in an effective integrated charge equal to that introduced by p-doped epitaxial layer 65.

According to an embodiment of the present disclosure, HEMT 75 operates as follows: during the on-state operation, a gate voltage (VG) is applied to the gate contact layer 88 by a gate electrode, where VG>pinch off voltage (Vp) of the device. A channel is formed under the gate contact layer 88 in channel region 84 if VG is sufficiently larger than Vp. The channel formed in channel region 84 under the gate contact layer 88 provides a low resistive path for carriers to flow from the source region 82 to the 2DEG region 72. The initial current flow in HEMT 75 is lateral, under the gate contact layer 88, then vertical in the 2DEG region 72 where carriers flow with high mobility towards substrate 76, and finally flow out of the drain contact region 89.

During the off-state, a gate voltage is applied to the gate electrode where VG<Vp (more negative than the pinch off voltage). No channel is formed between the source region 82 and the 2DEG region 72. The positive drain voltage across the drift region is then supported by 2DEG region 72, depleted by p-doped region 65. As outlined above the charge carriers, in the p-doped region 65 on one hand and 2DEG region 72 and charge carrying layer 73 on the other hand, deplete by drifting under the electric field towards their respective contacts, leaving behind bound ion charges of opposite polarities. According to an embodiment of the present disclosure, the opposite bound ion charges are equal in magnitude and closely spaced, and the net effective charge sum to a net zero value and result in a flat electric field distribution as illustrated in FIG. 6B. The super junction in HEMT 75 maintains a high breakdown voltage despite 2DEG region 72 by depleting 2DEG region 72 with p-doped region 65 before the critical electric field of HEMT 75 is reached. According to an embodiment of the present disclosure, doping of region 65 is a function of the width of the p column, which will be determined by the subsequent etch process.

According to an embodiment of the present disclosure, HEMT 75 can be formed as detailed above but without the charge carrying layer 73, so that 2DEG region 72 is formed in the p-doped region 65 at the interface with the charge-supplying layer 74. In such embodiment, p-doped region 65 and charge-supplying layer 74 are arranged such that the charges introduced by p-doped epitaxial layer 65 and 2DEG region 72 in the off-state HEMT generate a uniform electric field distribution across the 2DEG region.

According to an embodiment of the present disclosure, the super junction in HEMT 75 results in a lower on-state resistance since the structure enables the use of higher 2DEG density without impacting the Breakdown voltage (to a first order approximation) and also due to the use of a shorter drift region. Further, the flat electric field allows having a smaller drift region length which allows having a thinner Epitaxial layer 65 which allows having higher throughput of the Epi reactor, lower specific $R_{on}$ and lower cost.

FIG. 6C illustrates a cross-section of a portion of a high voltage super junction vertical HEMT 91 according to an embodiment of the present disclosure, essentially identical to high voltage vertical HEMT 75 of FIG. 6A, but wherein in addition a spacer layer 93 was grown between carrier supply layer 74 and the carrier carrying layer 73 for the purpose of enhancing the mobility of the 2DEG electrons in carrier carrying layer 73, the carrier supply layer 74 being subsequently grown on the spacer layer. The spacer layer 93 can for example be made of AlN if the carrier supply layer 74 is made of AlGaN, for example to prevent alloy disorder effect at the interface between the carrier supply layer 74 and the carrier carrying layer 73.

Figure 7A:
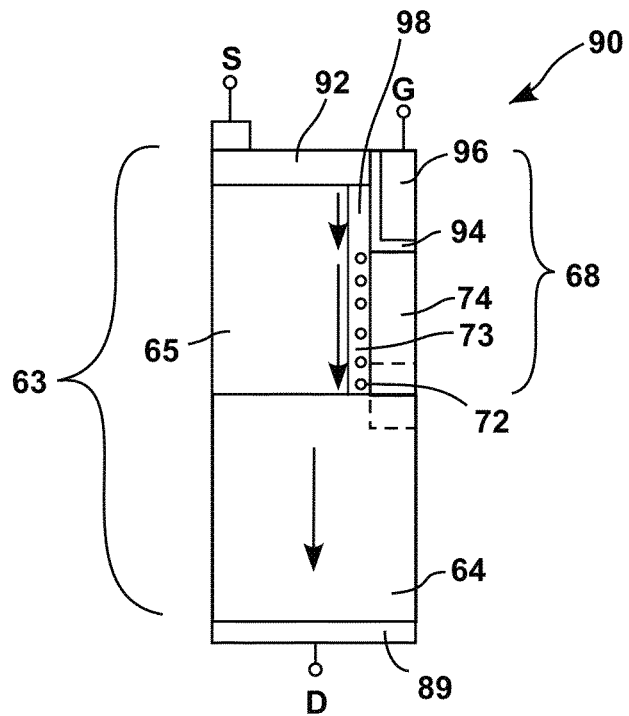
FIGS. 7A and 7B illustrate a cross-section of a portion of a high voltage super junction vertical trench HEMT according to embodiments of the present disclosure.

FIG. 7A illustrates a cross-section of a portion of a high voltage super junction vertical HEMT, or trench HEMT, 90 according to an embodiment of the present disclosure, made in a III-Nitride wafer 63 that comprises a free standing bulk III-Nitride material substrate 64 and a p-doped epitaxial layer 65 of III-Nitride material grown on substrate 64 as described previously in relation with FIG. 6A. According to an embodiment of the present disclosure, HEMT 90 comprises at least one recess 68 etched in p-doped epitaxial layer 65 as described previously in relation with FIG. 6A. For clarity, the polarization field 66 in wafer 63 is not illustrated in the present figure. According to an embodiment of the present disclosure, the polarization field 66 is perpendicular to the surface of plane wall 70 as shown in FIG. 5B.

According to an embodiment of the present disclosure, a carrier carrying layer 73 is grown on plane wall 70 of recess 68, and a carrier supply layer 74 is formed on a portion of carrier carrying layer 73 such that a 2DEG region 72 is formed in carrier carrying layer 73 along said portion of carrier carrying layer 73.

According to an embodiment of the present disclosure, carrier carrying layer 73 can be unintentionally doped epitaxial GaN and carrier supply layer 74 can be an epitaxial single crystal AlGaN, an epitaxial single crystal GaN/AlGaN or an epitaxial single crystal AlN/AlGaN.

According to an embodiment of the present disclosure, HEMT 90 comprises a doped source region 92 formed at the top of p-doped epitaxial layer 65 and carrier carrying layer 73, and extending parallel to the surface of substrate 64 up to the edge carrier carrying layer 73. According to an embodiment of the present disclosure, HEMT 90 comprises a gate insulating layer 94 formed on the portion of carrier carrying layer 73 not covered by carrier supply layer 74. The insulating layer can also be covering a top surface of carrier supply layer 74 in recess 68. According to an embodiment of the present disclosure, HEMT 90 comprises a gate region 96 formed in recess 68 on the gate insulating layer 94, thus forming a vertical channel region 98 in the portion of carrier carrying layer 73 that comprises no 2DEG region 72. According to an embodiment of the present disclosure, HEMT 90 comprises a drain contact region 89 on the bottom surface of substrate 64. At least a portion of the drift region of HEMT 90 comprises 2DEG region 72.

According to an embodiment of the present disclosure, HEMT 90 operates substantially as HEMT 75, except that in on-state operation a vertical channel is formed along the gate region 96 in channel region 98 if VG (voltage of the gate) is sufficiently larger than Vp (pinch off voltage of HEMT 90), which provides a low resistive path for carriers to flow from the source region 92 to the 2DEG region 72. The current flow in HEMT 90 is vertical along the gate region 96, then vertical in the 2DEG region 72 where carriers flow with high mobility towards substrate 64, and finally flow out of the drain contact region 89.

During the off-state, a gate voltage is applied to the gate electrode where VG<Vp (more negative than the pinch off voltage). No channel is formed between the source region 92 and the 2DEG region 72. The charges from p-doped region 65 deplete 2DEG 72 and the positive drain voltage across the drift is then supported by a depleted 2DEG region. According to an embodiment of the present disclosure, the super junction formed by p-doped region 65, carrier carrying layer 73 and 2DEG region 72 is designed to support the full drain voltage of HEMT 90 in off state.

Figure 7B:
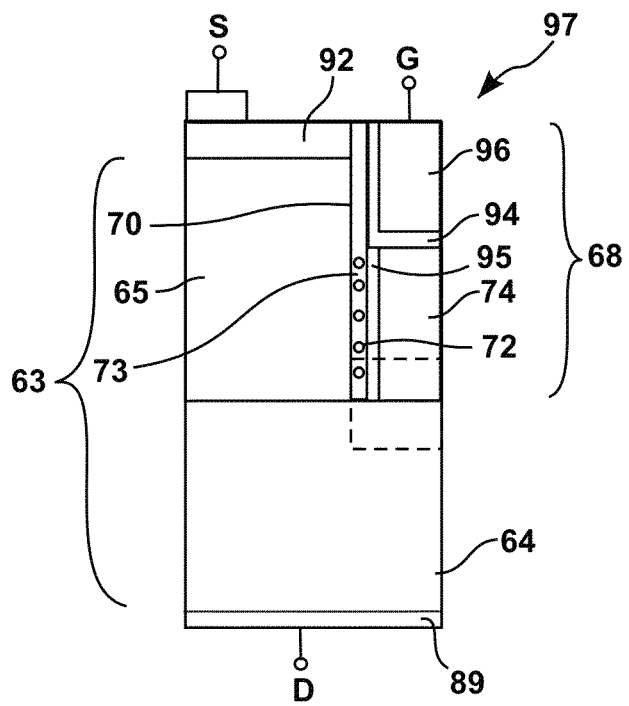

FIG. 7B illustrates a cross-section of a portion of a high voltage super junction vertical HEMT 97 according to an embodiment of the present disclosure, essentially identical to high voltage vertical HEMT 90 of FIG. 7A, but wherein in addition a spacer layer 95 similar to the one described in relation with FIG. 6C was formed prior to the carrier supply layer 74 on the carrier carrying layer 73, the carrier supply layer 74 being subsequently grown on the spacer layer 95.

According to an embodiment of the present disclosure, the following process flow can be used to manufacture one of HEMTs 75, 90, 91, or 97:

A n+ M-plane free standing GaN substrate 64 is provided, that acts as a highly doped drain region and provides a template to grow a layer of a p-doped GaN layer 65 on which the rest of the device structure is implemented. Because the p-doped GaN layer 65 is grown on top of the n+ M-plane GaN substrate 64, it has a similar m-plan crystallographic arrangement.

At least one trench 68 is then etched, for example perpendicular to the substrate plane, in the p-doped GaN layer 65, and extends vertically from the surface of layer 65 down to the n+ substrate 64. This trench might or might not extend deep enough to reach the n+ substrate 64. Depending on device optimization, the trench might penetrate the n+ substrate 64, or stop at the n+ substrate/UID interface or even stop before reaching that interface. The trench has at least one sidewall 70.

Figure 1A:
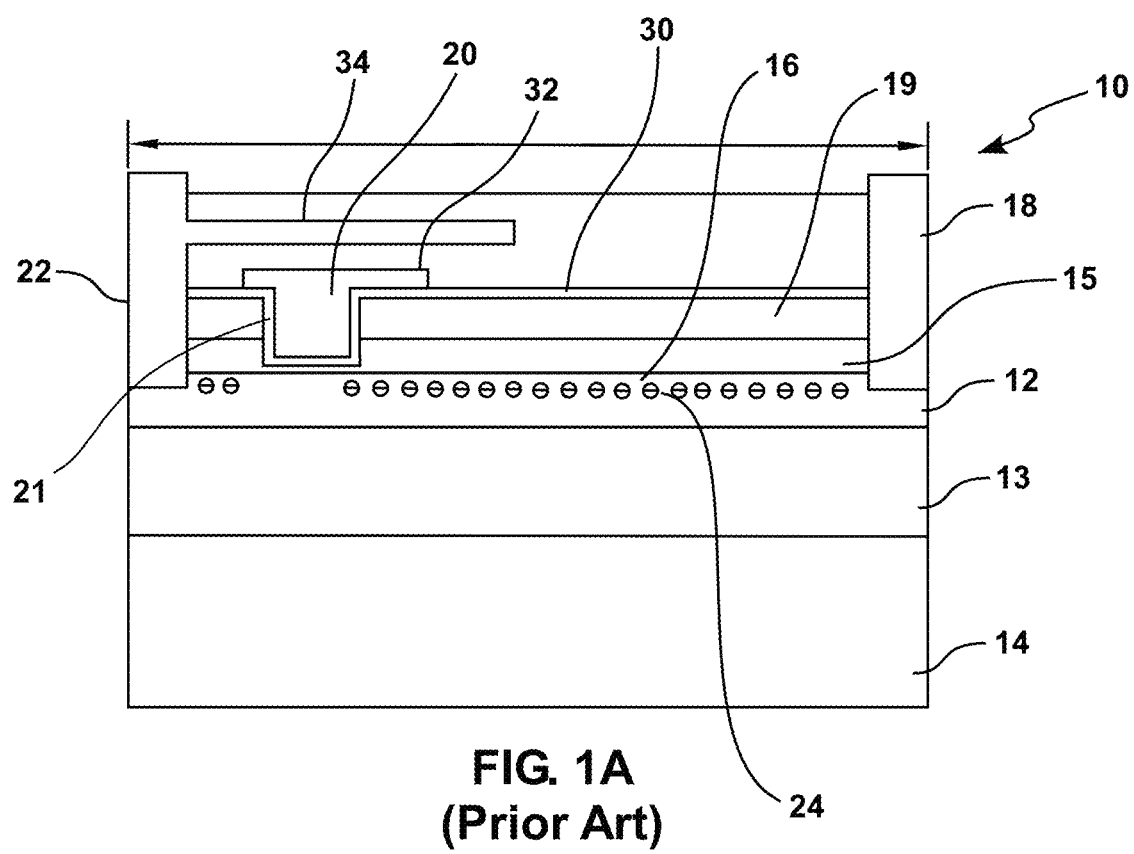
FIG. 1A illustrates a cross-section of a portion of a prior art high voltage 2DEG lateral HEMT.
Figure 1B:
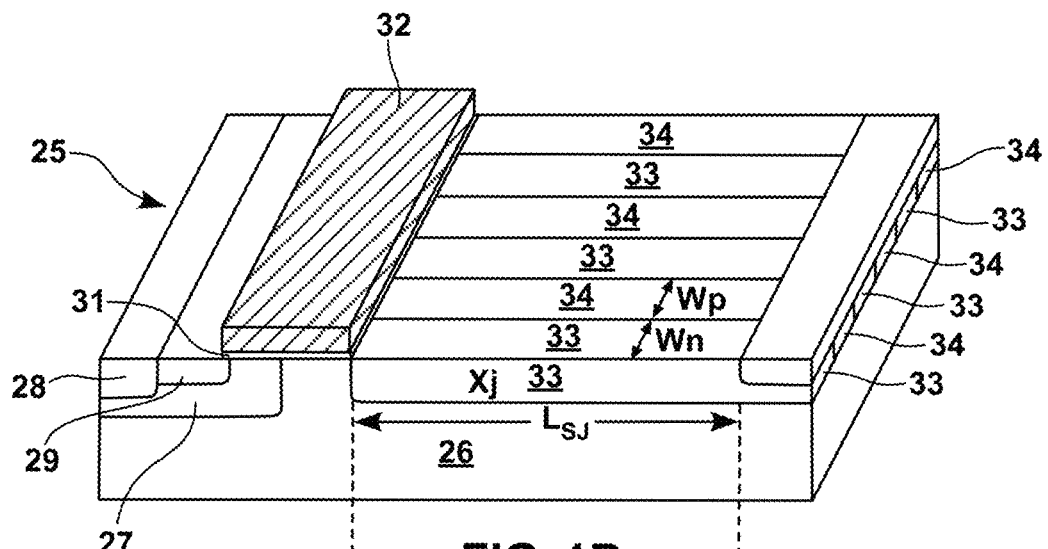
FIGS. 1B and 1C illustrate a cross-section of a portion of a prior art high voltage super junction lateral MOSFET and the electric field distribution in the super junction.
Figure 1C:
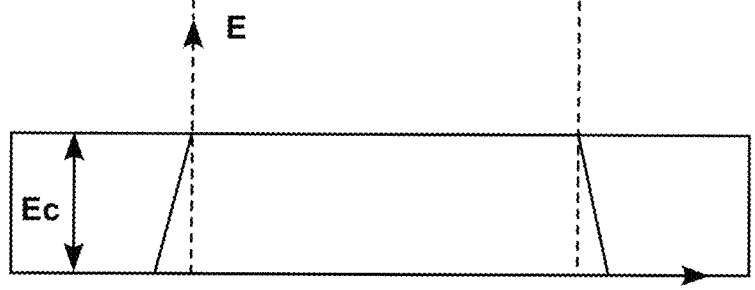
Figure 2:
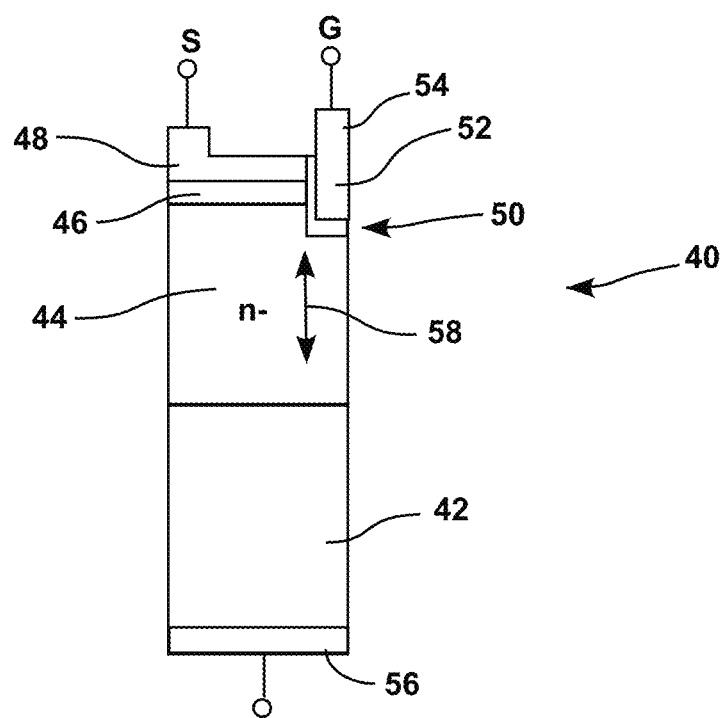
FIG. 2 illustrates a cross-section of a portion of a prior art high voltage vertical FET.

Within trench 68, which can be formed by one of the known methods to form high aspect ratio trenches such as reactive ion etching, a carrier carrying layer 73 that can be unintentionally doped GaN is grown is grown on sidewall 70. Then a III-Nitride layer 74, that will ultimately have the function of forming a vertical heteroepitaxial junction, is grown on carrier carrying layer 73. The composition and growth conditions of these heteroepitaxial layers are provided to set the correct conditions for both spontaneous and piezoelectric polarization in a way similar to that of the current supplying layer (typically AlGaN barrier) set the spontaneous and piezoelectric polarization in the conventional lateral HEMT structure of FIG. 1.

According to embodiments of the present disclosure, heteroepitaxial junction layer 74 can be composed of any number of layers. For example, the growth of layer 74 can involve only the regrowth of an AlGaN layer to form a heterostructure with layer 73. In another embodiment a spacer layer, for example of AlN, can be grown between layers 73 and 74.

According to embodiments of the present disclosure, heteroepitaxial junction layer(s) can be any combination of layers, or a single layer of III-Nitride materials, that will result in a vertically oriented heteroepitaxial junction with high quality interface and least defect density and that will enable the formation of the required vertical 2DEG region 72 at an heteroepitaxial interface along sidewall 70.

Regardless of which layer or layers will be used in the step of forming the heteroepitaxial junction layer(s), the end result is to achieve high quality regrown material with low defect density, high mobility of 2DEG and sufficiently high 2DEG density. For example, a 2DEG density of 5e12 to 1e13/cm2 can be considered as sufficiently high.

Further, the doping and thicknesses of layers 73 and 74 and layer 65 are chosen such that the charges introduced by p-doped epitaxial layer 65, carrier carrying layer 73 and 2DEG region 72 in the off-state HEMT generate a uniform electric field distribution across the 2DEG region.

After the growth of the III-Nitride heteroepitaxial junction layer(s) is completed, a deposition or a regrowth of a suitable passivation layer 80 to terminate the regrown layers can be done, as illustrated in FIG. 6A. PECVD, LPCVD or MOCVD Nitride (Si3N4) are all suitable candidates for the passivation step of forming passivation layer 80, however, the disclosure should not be limited to any of these materials and any appropriate passivation material that will have high immunity to current collapse (drain lag) issues will be suitable.

Thereafter a low Ohmic contact region is formed to implement source contact 82 or 92. A masked high dose ion implantation of donor type species such as Silicon followed by an RTA step can be used for source contact formation. Next, an insulating material is deposited or grown on the surface of p-doped epitaxial layer 65 or on a portion of sidewall 70 to form the gate dielectric 86 or 94. The insulating gate process is then followed by the deposition/evaporation with an appropriate gate material (or gate stack) 88 or 96. Back-end of line processes which include intermetallic dielectric deposition and metal evaporation or sputtering processes are done next to implement a low resistive source, drain interconnect network. It should be noted that in this vertical structure the drain metal is deposited at the back side of the wafer. To reduce the drain parasitic resistance, the n+m− plan substrate 64 can be thinned to an appropriate thickness before depositing the backside drain metal 89.

Figure 8A:
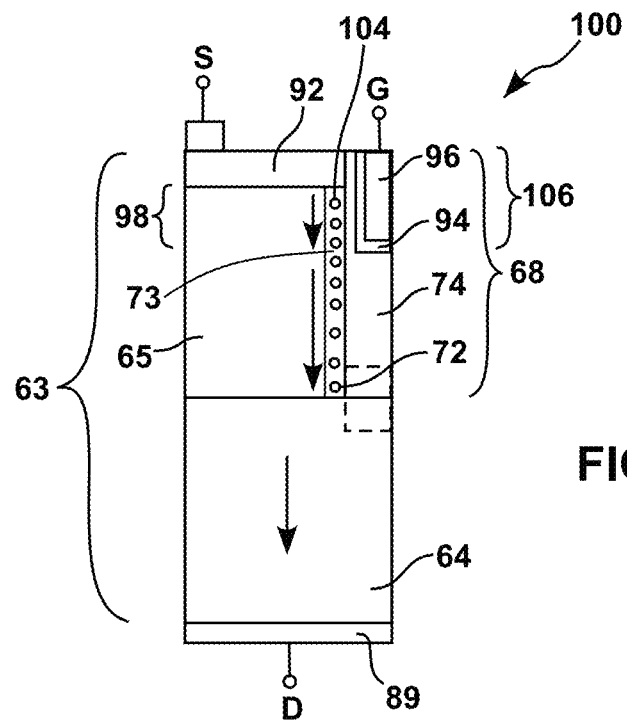
FIGS. 8A and 8B illustrate a cross-section of a portion of a high voltage super junction vertical trench HEMT according to embodiments of the present disclosure.

FIG. 8A illustrates a cross-section of a portion of a high voltage super junction vertical trench HEMT 100 according to an embodiment of the present disclosure. HEMT 100 is substantially identical to HEMT 90 described in relation with FIG. 7A, except that instead of comprising a carrier supply layer 74 grown only along a lower portion carrier carrying layer 73 along plane wall 70, HEMT 100 comprises a carrier supply layer 74 grown along the full height of carrier carrying layer 73 such that a further 2DEG region 104 is formed in carrier carrying layer 73 in the channel region 98 between source 92 and 2DEG region 72.

According to an embodiment of the present disclosure, carrier supply layer 74 comprises a surface recess 106 in which gate insulating layer 94 and gate region 96 are formed so as to have a vertical channel region 98 as detailed in relation with FIG. 7A. It is noted that, due to the further 2DEG region 104 in the channel region 98, HEMT 100 operates in a depletion mode instead of in an enhancement mode as HEMT 90.

Figure 8B:
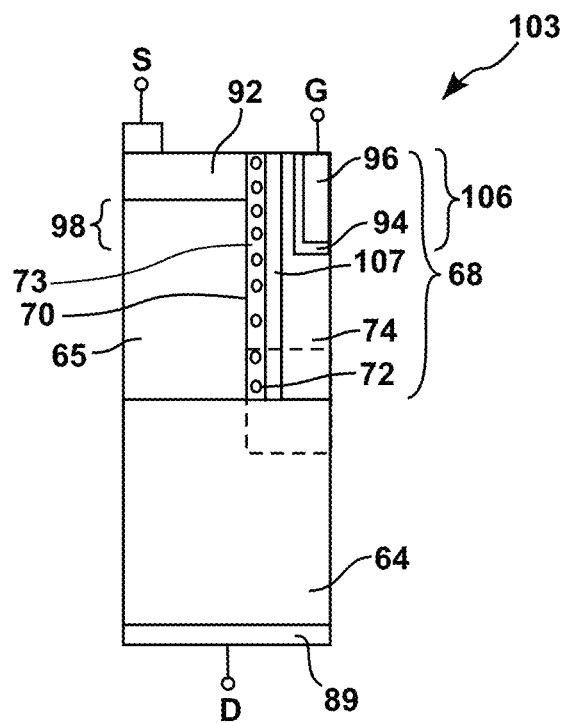

FIG. 8B illustrates a cross-section of a portion of a high voltage vertical HEMT 103 according to an embodiment of the present disclosure, essentially identical to high voltage vertical HEMT 100 of FIG. 8A, but wherein in addition a spacer layer 107 (similar to the spacer layer 95 described previously) was formed on the surface of carrier carrying layer 73 prior to the carrier supply layer 74, the carrier supply layer 74 being subsequently grown on the spacer layer 107.

Figure 9:
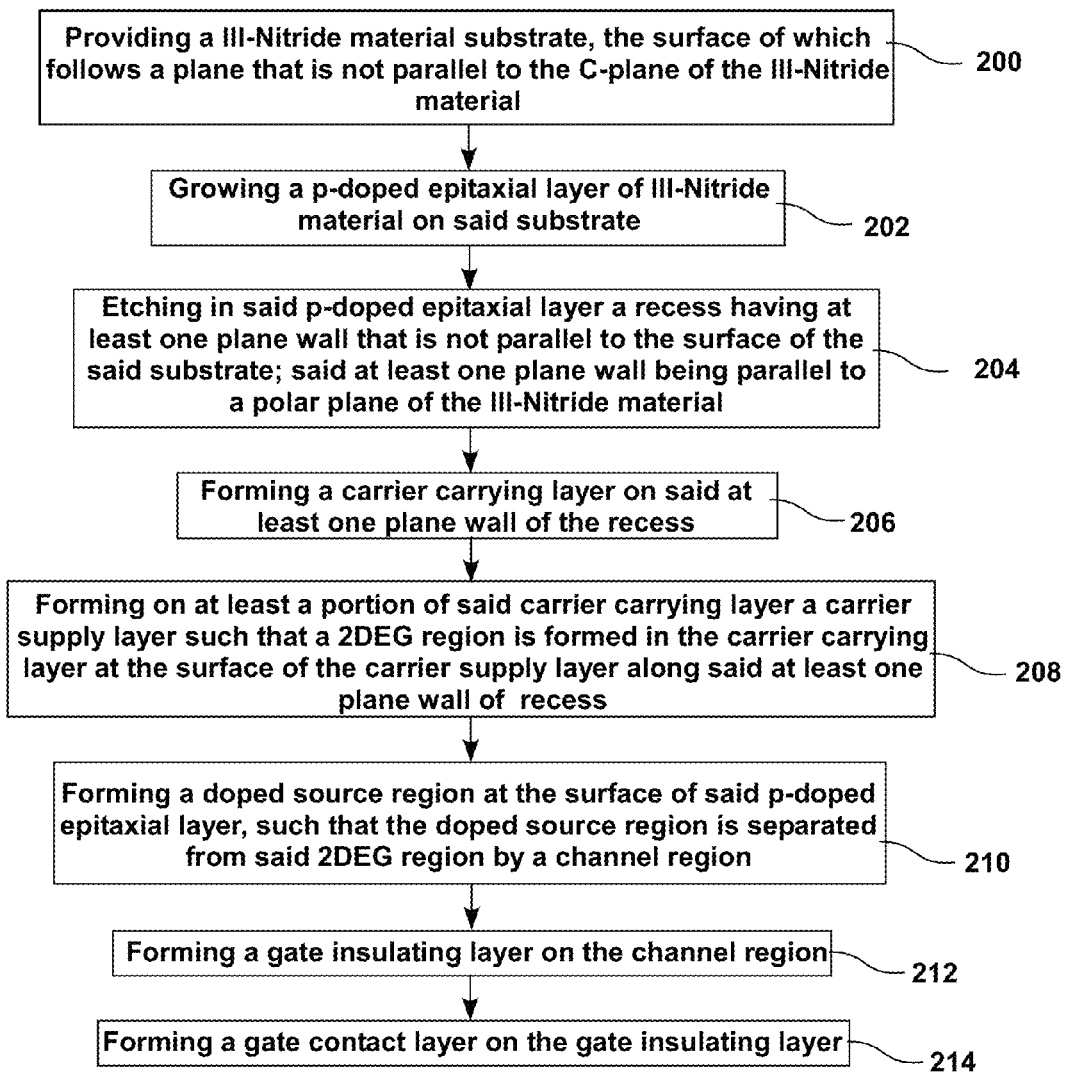
FIG. 9 illustrates a method of manufacturing a high voltage super junction vertical trench HEMT according to embodiments of the present disclosure.

FIG. 9 illustrates a method of manufacturing a high voltage super junction vertical trench HEMT according to embodiments of the present disclosure. The method comprises:

providing (200) a III-Nitride material substrate (e.g. 64), the surface of which follows a plane that is not parallel to the C-plane of the III-Nitride material;

growing (202) a p-doped epitaxial layer (e.g. 65) of III-Nitride material on said substrate;

etching (204) in said p-doped epitaxial layer a recess (e.g. 68) having at least one plane wall (e.g. 70) that is not parallel to the surface of the substrate; said at least one plane wall being parallel to a polar plane of the III-Nitride material;

forming (206) a carrier carrying layer (e.g. 73) on said at least one plane wall of the recess;

forming (208) on at least a portion of said carrier carrying layer a carrier supply layer (e.g. 74) such that a 2DEG region (e.g. 72) is formed in the carrier carrying layer at the interface with the carrier supply layer along said at least one plane wall of the recess;

forming (210) a doped source region (e.g. 82, 92) at the surface of said p-doped epitaxial layer, such that the doped source region is separated from said 2DEG region by a channel region (e.g. 84, 98);

forming (212) a gate insulating layer on the channel region; and forming (214) a gate contact layer on the gate insulating layer.

It is noted that a super junction HEMT according to the present disclosure improves greatly the scalability to high currents carrying capability as compared to the known, lateral, HEMTs as a result of cell pitch reduction. Indeed, scaling to higher currents capability in lateral GaN HEMTs is a non-trivial issue due to the coupling of current capability, defect density and blocking capability. It follows that a large area device is not capable of supporting high breakdown voltage that a smaller area device according to embodiments of the present disclosure is able to support, with identical design rules/technology.

It is noted that a super junction HEMT according to embodiments of the present disclosure will be suitable for High Voltage GaN device applications including Electrical Vehicles, Trucks, Traction application, HV transmission lines and naval applications where high efficient power switches are required. The total available market of discrete power devices is expected to reach $20 Billion by 2020. The HV market in which HV GaN HEMT can target is estimated at $8 Billion by 2020. The insertion of GaN based power devices in the aforementioned applications is of significant interest to car manufacturers, as well as energy and defense industries, due to the superior material properties of GaN HEMTs. Further, GaN based power devices are considered to be the main candidate to lead future roadmaps of energy efficient products. HEMTs according to the present disclosure are particularly useful in applications that require 1300V blocking capability, for example for the electrification of next generation vehicles. The global requirement for $CO_2$ emission reduction and the drive in the U.S. to reduce dependence on foreign oil are driving the market pull for energy efficient semiconductor devices that are superior in performance to the existing Silicon device which will enable operations at higher temperature that are not addressed by smaller band-gap ($Eg=1.1$ eV) of silicon based power devices.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated.

For example, an embodiment of the present disclosure comprises a HEMT device comprising a M-plane III-Nitride material substrate, a p-doped epitaxial layer of III-Nitride material grown on said substrate; a recess etched in said p-doped epitaxial layer, the recess having a plane wall parallel to a polar plane of the III-Nitride material; a carrier carrying layer formed on said plane wall of the recess; a carrier supply layer formed on said at least one carrier carrying layer, such that a 2DEG region is formed in the carrier carrying layer at the interface with the carrier supply layer along said plane wall of the recess; a doped source region formed at the surface of said p-doped epitaxial layer such that the doped source region is separated from said 2DEG region by a channel region; a gate insulating layer formed on the channel region; and a gate contact layer formed on the gate insulating layer.

For example, the super junction HEMTs illustrated in relation with FIGS. 6A and 7A are normally-off device. However, embodiments of the present disclosure also comprise normally on (depletion mode) HEMTs.

Further, the embodiments disclosed above comprise a super junction HEMT, but the present disclosure relates more generally to any semiconductor device having a super-junction drift region between two active regions, the super-junction drift region comprising at least a P-doped region extending between the two active regions, and a N-doped region extending between the two active regions adjacent the P-doped region, wherein the P-doped region and the N-doped region deplete each other at least partially; and wherein the N-doped region comprises a 2DEG region.

Further, the embodiments disclosed above comprise a super junction vertical HEMT using a 2DEG region as the N-doped region or column of the super junction, but the present disclosure relates more generally to any vertical semiconductor device having a superjunction drift region between two active regions, the superjunction drift region comprising at least a P-doped region extending between the two active regions, and a N-doped region extending between the two active regions adjacent the P-doped region, wherein the P-doped region and the N-doped region deplete each other at least partially; and wherein the N-doped region does not necessarily comprise a 2DEG region. Such embodiments could be illustrated by FIG. 6A, wherein layers 73 and 74 would be replaced by a single N-doped layer grown on wall 70, and wherein substrate 64 would not necessarily be a plane that is not parallel to the C-plane of the III-Nitride material. Such embodiments could alternatively comprise a vertical diode.

It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ."

It should be understood that the figures illustrated in the attachments, which highlight the functionality and advantages of the present invention, are presented for example purposes only. The architecture of the present invention is sufficiently flexible and configurable, such that it may be utilized (and navigated) in ways other than that shown in the accompanying figures.

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

The invention claimed is:

1. A method for making a HEMT device, the method comprising:
   providing a III-Nitride material substrate having a top plane surface that is not parallel to a C-plane of the III-Nitride material substrate;
   growing a p-doped epitaxial layer of III-Nitride material on said top surface of said substrate;
   etching in said p-doped epitaxial layer a recess having at least one plane wall that is not parallel to the surface of the substrate; said at least one plane wall being parallel to a polar plane of the III-Nitride material of the p-doped epitaxial layer;
   forming a carrier carrying layer on said at least one plane wall of the recess;
   forming on at least a portion of said carrier carrying layer a carrier supply layer such that a 2DEG region is formed in the carrier carrying layer at the interface with the carrier supply layer along said at least one plane wall of the recess;
   forming a doped source region at the surface of said p-doped epitaxial layer, such that the doped source region is separated from said 2DEG region by a channel region;
   forming a gate insulating layer on the channel region; and
   forming a gate contact layer on the gate insulating layer.

2. The method of claim 1, comprising arranging said p-doped epitaxial layer and said 2DEG region such that in the off-state HEMT the carriers in said p-doped epitaxial layer, said carrier carrying layer and said 2DEG region deplete each other, leaving behind a net effective charge that sums to zero, thus generating a uniform electric field distribution across the 2DEG region.

3. The method of claim 1, wherein said channel region extends parallel to the surface of the substrate.

4. The method of claim 1, wherein said channel region extends parallel to said at least one plane wall of the recess.

5. The method of claim 4, said at least one carrier supply layer and said at least one carrier carrying layer are arranged on said at least one plane wall of the recess such that a further 2DEG region is formed along the channel region.

6. The method of claim 1, wherein said at least one plane wall of the recess is parallel to the C-plane of the III-Nitride material.

7. The method of claim 6, wherein at least one plane wall of the recess is perpendicular to the surface of the substrate.

8. The method of claim 7, wherein the surface of the substrate is parallel to a M-plane of the III-Nitride material of the p-doped epitaxial layer.

9. The method of claim 7, wherein the surface of the substrate is parallel to the A-plane of the III-Nitride material.

10. The method of claim 1, wherein the III-Nitride material substrate is GaN.

11. The method of claim 10, wherein the III-Nitride material of the p-doped epitaxial layer is GaN.

12. The method of claim 11, wherein the carrier supply layer comprises one of an epitaxial single crystal AlGaN, an epitaxial GaN/AlGaN and an epitaxial AlN/AlGaN, and the carrier carrying layer comprises unintentionally doped epitaxial single crystal GaN.

13. The method of claim 1, comprising forming a spacer layer formed between the carrier carrying layer and the carrier supply layer.

14. The method of claim 13, wherein the spacer layer comprises AlN.

\* \* \* \* \*